United States Patent
Kohno

(10) Patent No.: US 11,462,384 B2
(45) Date of Patent: Oct. 4, 2022

(54) METHOD OF ACQUIRING DARK-FIELD IMAGE

(71) Applicant: JEOL Ltd., Tokyo (JP)

(72) Inventor: Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/017,840

(22) Filed: Sep. 11, 2020

(65) Prior Publication Data

US 2021/0082663 A1 Mar. 18, 2021

(30) Foreign Application Priority Data

Sep. 12, 2019 (JP) .............................. JP2019-166010

(51) Int. Cl.
| | | |
|---|---|---|
| *H01J 37/28* | (2006.01) | |
| *H01J 37/10* | (2006.01) | |
| *H01J 37/147* | (2006.01) | |
| *H01J 37/153* | (2006.01) | |
| *H01J 37/244* | (2006.01) | |
| *H01J 37/26* | (2006.01) | |

(52) U.S. Cl.
CPC .............. *H01J 37/28* (2013.01); *H01J 37/10* (2013.01); *H01J 37/147* (2013.01); *H01J 37/153* (2013.01); *H01J 37/244* (2013.01); *H01J 37/265* (2013.01); *H01J 2237/1534* (2013.01); *H01J 2237/24475* (2013.01); *H01J 2237/2802* (2013.01)

(58) Field of Classification Search
CPC .. H01J 37/00; H01J 37/02; H01J 37/28; H01J 37/10; H01J 37/147; H01J 37/153; H01J 37/244; H01J 37/265; H01J 37/2955; H01J 37/27; H01J 37/285; H01J 37/224; H01J 37/26; H01J 2237/1534; H01J 2237/24475; H01J 2237/2802
USPC ......................................... 250/306, 307, 311
See application file for complete search history.

(56) References Cited

U.S. PATENT DOCUMENTS

| | | | |
|---|---|---|---|
| 2007/0125945 A1* | 6/2007 | van der Zande | ..... H01J 37/153 250/307 |
| 2007/0158568 A1* | 7/2007 | Nakamura | ............ H01J 37/153 250/311 |
| 2009/0159797 A1 | 6/2009 | Fukushima | |

(Continued)

FOREIGN PATENT DOCUMENTS

| | | |
|---|---|---|
| JP | 2009152087 A | 7/2009 |
| JP | 201243563 A | 3/2012 |

OTHER PUBLICATIONS

Extended European Search Report issued in EP20195802.2 dated Feb. 4, 2021.

*Primary Examiner* — Jason L McCormack
(74) *Attorney, Agent, or Firm* — The Webb Law Firm

(57) ABSTRACT

A method of acquiring a dark-field image for a scanning transmission electron microscope is provided. The scanning transmission electron microscope includes a dark-field detector having an annular detection region which is capable of detecting electrons scattered at a specimen in a predetermined angular range, an objective lens, and an imaging lens group disposed at a stage following the objective lens. The method includes reducing an influence of a geometrical aberration on the electrons scattered in the predetermined angular range by shifting a focus of the imaging lens group from a diffraction plane of the objective lens.

3 Claims, 6 Drawing Sheets

(56) References Cited

U.S. PATENT DOCUMENTS

| | | | |
|---|---|---|---|
| 2013/0206987 A1* | 8/2013 | Omoto | H01J 37/10 250/311 |
| 2013/0256531 A1* | 10/2013 | Yoshida | H01J 37/28 250/307 |
| 2017/0236684 A1 | 8/2017 | Kohno | |
| 2018/0269031 A1* | 9/2018 | Stanislav | H01J 37/244 |

* cited by examiner

METHOD OF ACQUIRING DARK-FIELD IMAGE

CROSS-REFERENCE TO RELATED APPLICATION

This application claims priority to Japanese Patent Application No. 2019-166010 filed Sep. 12, 2019, the disclosure of which is hereby incorporated by reference in its entirety.

BACKGROUND OF THE INVENTION

Field of the Invention

The present invention relates to a method of acquiring a dark-field image.

Description of Related Art

A scanning transmission electron microscope (STEM) is an electron microscope that acquires a scanning transmission electron microscope image (STEM image) by scanning a converged electron beam over a specimen and mapping the intensity of detection signals obtained by transmitted electrons or scattered electrons from the specimen in synchronization with the scanning. In recent years, the scanning transmission electron microscope is attracting attention as an electron microscope with which an extremely high spatial resolution at the atomic scale can be obtained.

In general, in a scanning electron microscope, when the STEM image is acquired, an imaging lens group formed by an intermediate lens and a projector lens is focused on a diffraction plane of an objective lens, and the diffraction plane of the objective lens and a detection plane of a detector are conjugated.

As an observing technique using the scanning transmission electron microscope, high-angle annular dark-field scanning transmission electron microscopy (HAADF-STEM) is known (for example, see JP-A-2009-152087). The high-angle annular dark-field scanning transmission electron microscopy is a technique of acquiring a STEM image by detecting an electron beam scattered at high angles of 50 mrad or more with use of a detector having an annular detection region.

In the high-angle annular dark-field scanning transmission electron microscopy, electrons scattered in a predetermined angular range can be detected by the annular detection region.

When the geometrical aberration of the objective lens is large, the electrons scattered by the specimen are converged stronger as the angle by which the electrons are scattered is higher. Therefore, there may be cases where the electrons scattered in a predetermined angular range are not accurately detected even when the detector having the annular detection region is used.

SUMMARY OF THE INVENTION

According to an aspect of the invention, there is provided a method of acquiring a dark-field image for a scanning transmission electron microscope, the scanning transmission electron microscope including:
a dark-field detector having an annular detection region which is capable of detecting electrons scattered at a specimen in a predetermined angular range;
an objective lens; and
an imaging lens group disposed at a stage following the objective lens,
the method including:
reducing an influence of a geometrical aberration on the electrons scattered in the predetermined angular range by shifting a focus of the imaging lens group from a diffraction plane of the objective lens.

DESCRIPTION OF THE INVENTION

According to an embodiment of the invention, there is provided a method of acquiring a dark-field image for a scanning transmission electron microscope, the scanning transmission electron microscope including:
a dark-field detector having an annular detection region which is capable of detecting electrons scattered at a specimen in a predetermined angular range;
an objective lens; and
an imaging lens group disposed at a stage following the objective lens, the method including:
reducing an influence of a geometrical aberration on the electrons scattered in the predetermined angular range by shifting a focus of the imaging lens group from a diffraction plane of the objective lens.

In the method of acquiring a dark-field image as above, even when the influence of the geometrical aberration of the objective lens is large, the electrons scattered in a predetermined angular range can be accurately detected by the dark-field detector.

Preferred embodiments of the invention are described in detail below with reference to the drawings. It is noted that the following embodiments do not unduly limit the scope of the invention as stated in the claims. In addition, all of the elements described below are not necessarily essential requirements of the invention.

1. Scanning Transmission Electron Microscope

Figures 1, 2:
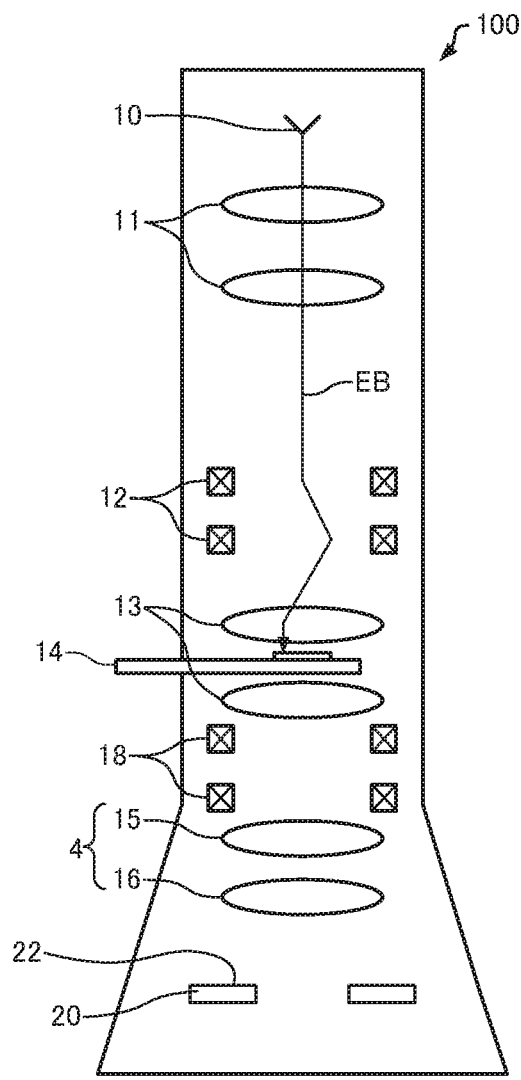
FIG. 1 illustrates a configuration of a scanning transmission electron microscope.
FIG. 2 is a flowchart illustrating one example of a method of acquiring a dark-field image according to one embodiment of the invention.

First, a scanning transmission electron microscope used in a method of acquiring a dark-field image according to one embodiment of the invention is described with reference to the drawings. FIG. 1 illustrates a configuration of a scanning transmission electron microscope 100 used in the method of acquiring a dark-field image according to one embodiment of the invention.

As illustrated in FIG. 1, the scanning transmission electron microscope 100 includes an electron source 10, an illumination-lens system 11, a scanning deflector 12, an objective lens 13, a specimen stage 14, an intermediate lens 15, a projector lens 16, a de-scanning coil 18 (one example of an imaging system deflector), and a dark-field detector 20.

The electron source 10 generates an electron beam EB. The electron source 10 is an electron gun that emits the electron beam EB by accelerating electrons emitted from a cathode at an anode, for example.

The illumination-lens system 11 converges the electron beam EB generated by the electron source 10. The scanning deflector 12 deflects the electron beam EB emitted from the electron source 10. By supplying a scanning signal supplied from a control apparatus (not shown) to the scanning deflector 12, the converged electron beam EB can be scanned over a specimen S.

The objective lens 13 converges the electron beam EB on the specimen S. By converging the electron beam EB by the illumination-lens system 11 and the objective lens 13, an electron probe can be formed. The objective lens 13 images the electrons transmitted through the specimen S.

The specimen stage 14 holds the specimen S. The specimen stage 14 can move the specimen S in the horizontal direction and the vertical direction and tilt the specimen S.

The intermediate lens 15 is disposed in a stage following the objective lens 13 (the downstream side of the electron beam EB). The projector lens 16 is disposed in a stage following the intermediate lens 15. The intermediate lens 15 and the projector lens 16 form an imaging lens group 4. The imaging lens group 4 guides the electrons scattered by the specimen S at high angles to a detection region 22 of the dark-field detector 20.

The de-scanning coil 18 is disposed between the objective lens 13 and the intermediate lens 15. The de-scanning coil 18 deflects the electron beam EB transmitted through the specimen S.

The dark-field detector 20 is provided in a stage following the projector lens 16. The dark-field detector 20 has the annular detection region 22. The dark-field detector 20 detects the electrons scattered by the specimen S in a predetermined angular range by the detection region 22. For example, the dark-field detector 20 detects the electrons scattered by the specimen S in a range of from 50 mrad to 200 mrad.

Although not shown, the scanning transmission electron microscope 100 may include a detector that detects electrons scattered by the specimen S at low angles and electrons transmitted through the specimen S without being scattered by the specimen S.

2. Method of Acquiring Dark-Field Image

Next, a method of acquiring a dark-field image according to one embodiment of the invention is described. FIG. 2 is a flowchart illustrating one example of the method of acquiring a dark-field image according to one embodiment of the invention.

The method of acquiring a dark-field image in the scanning transmission electron microscope 100 includes a step (S10) of reducing the influence of the geometrical aberration on the electrons scattered in a predetermined angular range by shifting a focus of the imaging lens group 4 from the diffraction plane of the objective lens 13. The method of acquiring a dark-field image in the scanning transmission electron microscope 100 further includes a step (S20) of correcting, with use of the de-scanning coil 18, the deviation of the electron beam EB from an optical axis A generated by shifting the focus of the imaging lens group 4 from the diffraction plane of the objective lens 13.

In the scanning transmission electron microscope 100, the electrons scattered by the specimen S at high angles enter the detection region 22 of the dark-field detector 20 by the objective lens 13, the intermediate lens 15, and the projector lens 16. The electrons scattered by the specimen S in the range of from 50 mrad to 200 mrad enter the detection region 22 here. Therefore, the integrated intensities of the electrons scattered by the specimen S in the range of from 50 mrad to 200 mrad can be obtained. As a result, a HAADF-STEM image can be acquired in the scanning transmission electron microscope 100.

The objective lens 13 has geometrical aberrations such as the spherical aberration and the coma aberration. In particular, the spherical aberration has a great influence on the performance of the scanning transmission electron microscope 100.

Figure 3:
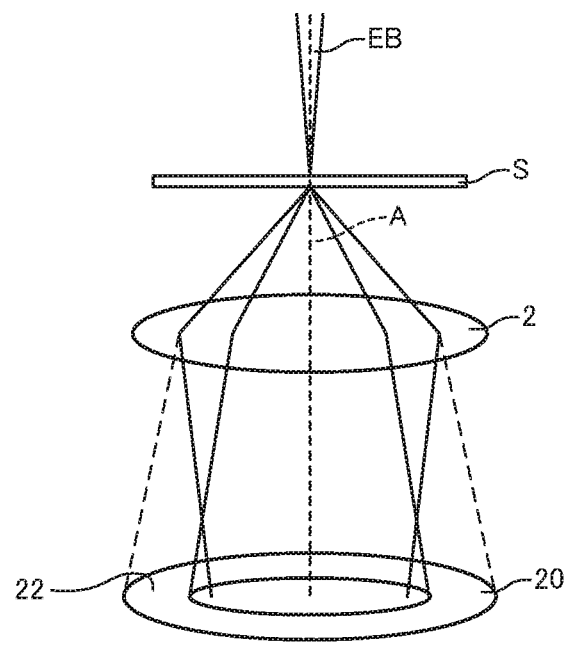
FIG. 3 illustrates a state in which an objective lens has a large geometrical aberration.

FIG. 3 illustrates a state in which the objective lens 13 has a large geometrical aberration. In FIG. 3, the objective lens 13, the intermediate lens 15, and the projector lens 16 are expressed as one imaging lens 2.

As illustrated in FIG. 3, when the geometrical aberration of the objective lens 13 is large, the electrons that are scattered at higher angles are converged stronger in the objective lens 13. As a result, the electrons scattered by the specimen S in the range of from 50 mrad to 200 mrad cannot be accurately detected by the dark-field detector 20.

(1) Step S10

In the scanning transmission electron microscope 100, the influence of the geometrical aberration on the electrons scattered by the specimen S in the range of from 50 mrad to 200 mrad is reduced by shifting the focus of the imaging lens group 4 from the diffraction plane of the objective lens 13.

Figure 4:
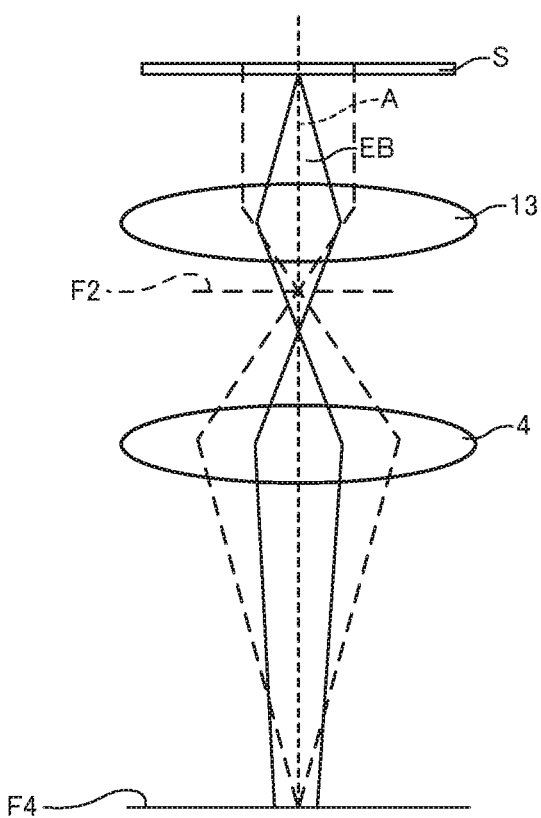
FIG. 4 illustrates a state in which an imaging lens group is focused on a diffraction plane of an objective lens.
Figure 5:
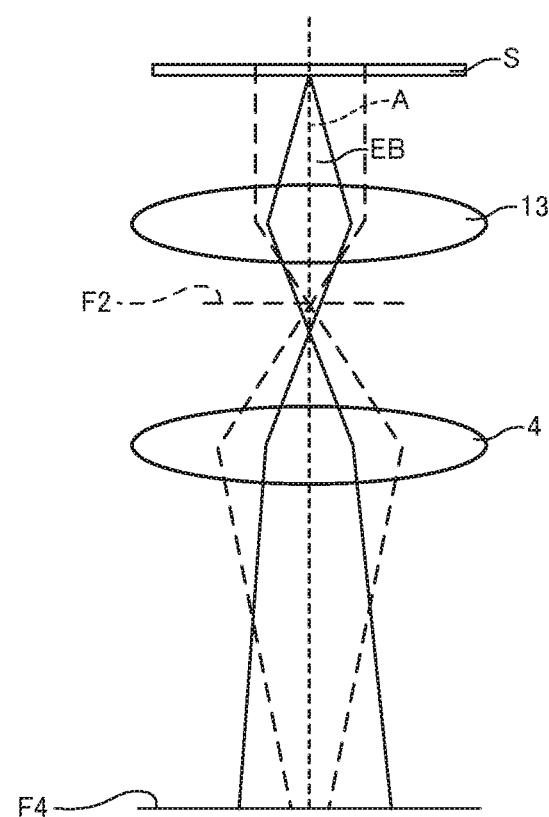
FIG. 5 illustrates a state in which a focus of an imaging lens group is shifted from a diffraction plane of an objective lens.

FIG. 4 illustrates a state in which the imaging lens group 4 is focused on a diffraction plane F2 of the objective lens 13. FIG. 5 illustrates a state in which the focus of the imaging lens group 4 is shifted from the diffraction plane F2 of the objective lens 13.

The diffraction plane F2 of the objective lens 13 is a back focal plane of the objective lens 13. On the diffraction plane F2 of the objective lens 13, an electron diffraction pattern is formed. A detection plane F4 is a plane in which the detection region 22 of the dark-field detector 20 is disposed.

As illustrated in FIG. 4, in a state in which the imaging lens group 4 is focused on the diffraction plane F2 of the objective lens 13, the diffraction plane F2 of the objective lens 13 and the detection plane F4 are conjugated. In this state, when the geometrical aberration of the objective lens 13 is large, the electrons scattered by the specimen S at higher angles are converged stronger in the objective lens 13 as illustrated in FIG. 3. Therefore, the electrons scattered by the specimen S in the range of from 50 mrad to 200 mrad cannot be accurately detected by the dark-field detector 20.

Therefore, as illustrated in FIG. 5, the influence of the geometrical aberration on the electrons scattered by the specimen S in the range of from 50 mrad to 200 mrad is reduced by shifting the focus of the imaging lens group 4 from the diffraction plane F2 of the objective lens 13. In the example illustrated in FIG. 5, the focus of the imaging lens group 4 is under-focused with respect to diffraction plane F2 by causing the excitation of the imaging lens group 4 to be weak.

Specifically, the difference in the focus position that depends on the angle generated by the geometrical aberration between the electrons scattered by the specimen S in the range of from 50 mrad to 200 mrad is corrected by defocus generated by shifting the focus of the imaging lens group 4 from the diffraction plane F2 of the objective lens 13.

Figure 6:
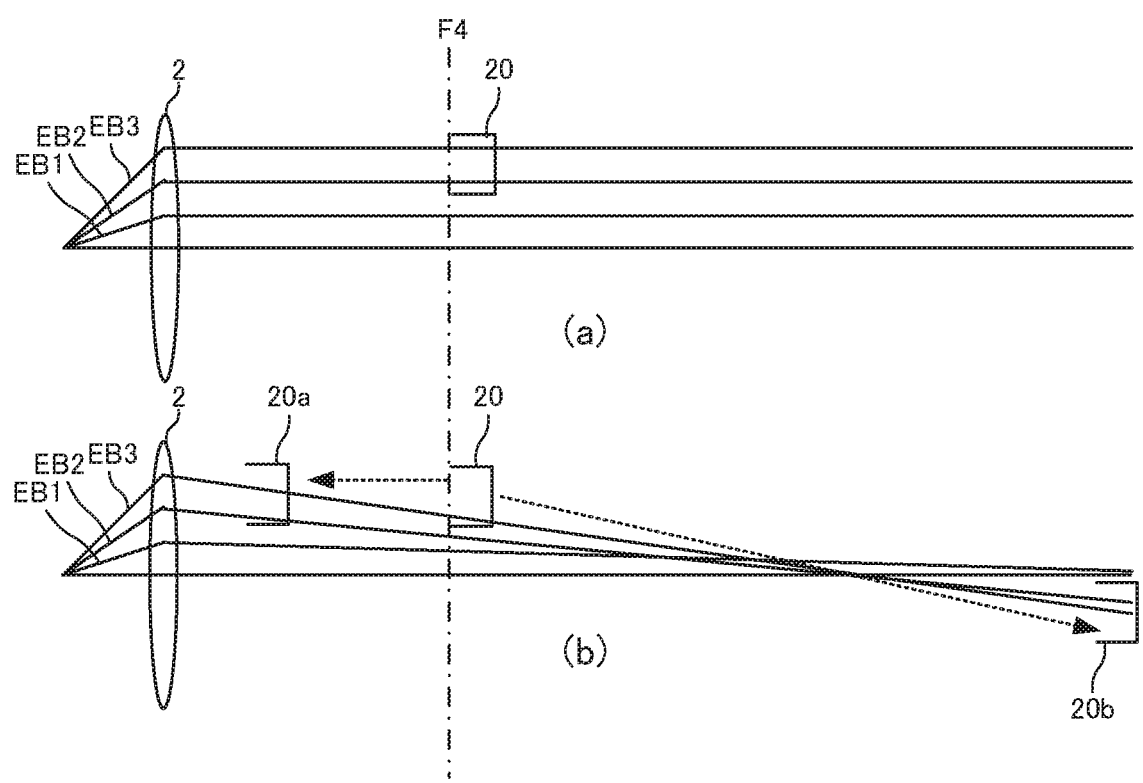
FIG. 6 illustrates State (a) in which an objective lens does not have a large geometrical aberration, and State (b) in which an objective lens has a large geometrical aberration.

FIG. 6 illustrates State (a) in which the objective lens does not have a large geometrical aberration, and State (b) in which the objective lens has a large geometrical aberration. In FIG. 6, electron beams scattered at a low angle to a high angle are denoted by reference characters EB1, EB2, and EB3.

In the state in which the objective lens does not have a large geometrical aberration, the electrons scattered at high angles and the electrons scattered at low angles are converged at the same intensity. Therefore, as illustrated in State (a) in FIG. 6, the electron beams EB2 and EB3 are detected by the dark-field detector 20 disposed in the detection plane F4.

In the state in which the objective lens has a large geometrical aberration, the electrons that are scattered at higher angles are converged stronger. As illustrated in State (b) in FIG. 6, the electron beam EB3 is detected by the dark-field detector 20 disposed in the detection plane F4. As described above, the detection results are different between the state in which the objective lens has a large geometrical aberration and the state in which the objective lens does not have a large geometrical aberration.

As illustrated in State (b) in FIG. 6, even in the state in which the objective lens has a large geometrical aberration, a dark-field detector 20*a* disposed in a position closer to the specimen than the dark-field detector 20 disposed in the detection plane F4 and a dark-field detector 20*b* disposed in a position farther from the specimen than the dark-field detector 20 disposed in the detection plane F4 can detect the electron beams EB2 and EB3, and can obtain a detection result similar to that obtained in the state in which the objective lens does not have a large geometrical aberration.

Even when the dark-field detector 20 disposed in the detection plane F4 is used, detection conditions equivalent to those in State (a) in FIG. 6 can be obtained by moving a plane conjugate to the detection plane F4 by shifting the focus of the imaging lens group 4 from the diffraction plane F2 of the objective lens 13. In other words, the detection result similar to that obtained in the state in which the objective lens does not have a large geometrical aberration can be obtained.

Figure 7:
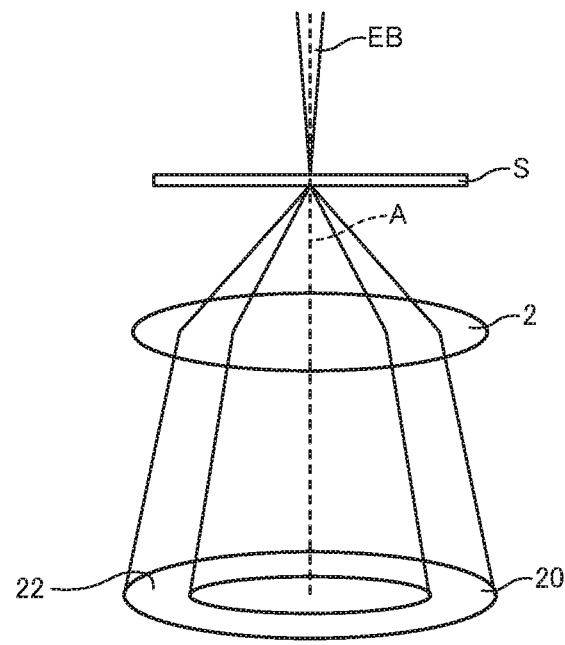
FIG. 7 illustrates a result obtained by reducing an influence of a geometrical aberration of electrons scattered by a specimen in a range of from 50 mrad to 200 mrad.

FIG. 7 illustrates a result obtained when the influence of the geometrical aberration on the electrons scattered by the specimen S in the range of from 50 mrad to 200 mrad is reduced.

As illustrated in FIG. 7, the electrons scattered by the specimen S in the range of from 50 mrad to 200 mrad can be accurately detected by the dark-field detector 20 by reducing the influence of the geometrical aberration on the electrons scattered by the specimen S in the range of from 50 mrad to 200 mrad.

As described above, in the example illustrated in FIG. 5, the imaging lens group 4 is under-focused with respect to the diffraction plane F2. Meanwhile, the imaging lens group 4 may be overfocused with respect to the diffraction plane F2 by causing the excitation of the imaging lens group 4 to be strong.

Figure 8:
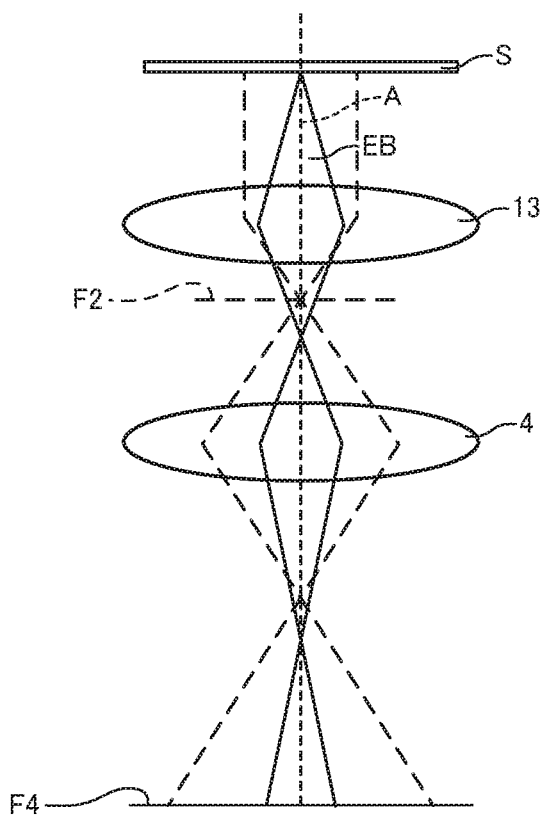
FIG. 8 illustrates a state in which a focus of an imaging lens group is shifted from a diffraction plane of an objective lens.

FIG. 8 illustrates a state in which the focus of the imaging lens group 4 is shifted from the diffraction plane F2 of the objective lens 13. FIG. 8 illustrates a state in which the imaging lens group 4 is overfocused with respect to the diffraction plane F2.

Figure 9:
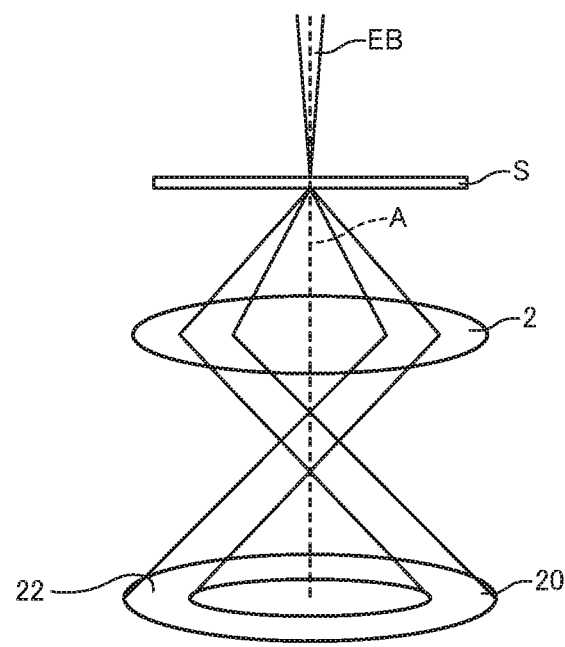
FIG. 9 illustrates a result obtained by reducing an influence of a geometrical aberration of electrons scattered by a specimen in a range of from 50 mrad to 200 mrad.

As illustrated in FIG. 8, the imaging lens group 4 is overfocused with respect to the diffraction plane F2 by causing the excitation of the imaging lens group 4 to be strong. As a result, as illustrated in FIG. 9, the electrons scattered by the specimen S in the range of from 50 mrad to 200 mrad can be accurately detected by the dark-field detector 20.

(2) Step S20

As illustrated in FIGS. 5 and 8, when the focus of the imaging lens group 4 is shifted from the diffraction plane F2 of the objective lens 13, the diffraction plane F2 and the detection plane F4 are not conjugated. Therefore, when the electron beam EB is scanned over the specimen S, entering positions of the electrons in the detection plane F4 move in accordance with the scanning with the electron beam EB.

Therefore, in the scanning transmission electron microscope 100, the deviation of the electron beam EB from the optical axis A generated by shifting the focus of the imaging lens group 4 from the diffraction plane F2 is corrected with use of the de-scanning coil 18. In other words, the electron beam EB deflected from the optical axis A by shifting the focus of the imaging lens group 4 from the diffraction plane F2 is brought back to the optical axis A with use of the de-scanning coil 18. Therefore, the electron beam EB can be caused to match with the optical axis A. As a result, the electron beam EB can be prevented from moving in the detection plane F4 in accordance with the scanning with the electron beam EB.

By shifting the focus of the imaging lens group 4 from the diffraction plane F2, information of the image plane is included in the electron beam EB in the detection plane F4. However, the diameter of the electron beam EB is extremely small in the scanning transmission electron microscope 100, and hence problems do not occur.

3. Effects

A method of acquiring a dark-field image according to one embodiment of the invention has the following effects, for example.

A method of acquiring a dark-field image according to one embodiment of the invention includes a step of reducing an influence of a geometrical aberration of electrons scattered in a predetermined angular range by shifting a focus of the imaging lens group 4 from the diffraction plane F2 of the objective lens 13. Therefore, even when the influence of the geometrical aberration of the objective lens 13 is large, the electrons scattered in a predetermined angular range can be accurately detected by the dark-field detector 20.

For example, when the influence of the geometrical aberration is large, the electrons scattered at high angles have been needed to be cut by an aperture (not shown) disposed in an imaging system. In a method of acquiring a dark-field image according to one embodiment of the invention, the influence of the geometrical aberration on the electrons scattered in a predetermined angular range is reduced by shifting the focus of the imaging lens group 4 from the diffraction plane F2 of the objective lens 13, and hence a problem as above does not occur.

A method of acquiring a dark-field image according to one embodiment of the invention includes a step of correcting, with use of the de-scanning coil 18, a deviation of the electron beam EB from the optical axis A generated by shifting the focus of the imaging lens group 4 from the diffraction plane F2 of the objective lens 13. Therefore, the electron beam EB can be prevented from moving in the detection plane F4 in accordance with the scanning with the electron beam EB.

In a method of acquiring a dark-field image according to one embodiment of the invention, the step of reducing the influence of the geometrical aberration includes correcting a difference in focus position that depends on an angle due to the geometrical aberration between the electrons scattered in the predetermined angular range by defocus generated by shifting the focus of the imaging lens group 4 from the diffraction plane F2 of the objective lens 13. Therefore, even when the influence of the geometrical aberration of the objective lens 13 is large, the electrons scattered in a predetermined angular range can be accurately detected by the dark-field detector 20.

The invention is not limited to the abovementioned embodiments and may be modified and embodied in various ways within the scope of the invention.

For example, in the abovementioned embodiments, a case where the dark-field detector 20 detects the electrons scattered by the specimen S in the range of from 50 mrad to 200 mrad has been described. However, the range of the scattering angles that can be detected by the dark-field detector 20 is not particularly limited as long as the range is a range of high angles of 50 mrad or more.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A method of acquiring a dark-field image acquired by scanning an electron beam over a specimen for a scanning transmission electron microscope,
the scanning transmission electron microscope comprising:
a dark-field detector having an annular detection region configured to detect electrons scattered at a specimen in a predetermined angular range;
an objective lens;
an imaging lens group disposed at a stage following the objective lens;
a scanning deflector that scans the electron beam over the specimen; and
an imaging system deflector that deflects the electron beam transmitted through the specimen,
the method comprising:
causing the electrons scattered in the predetermined angular range to enter the dark-field detector by correcting a difference in a focus position that depends on an angle generated by a geometrical aberration between the electrons scattered in the predetermined angular range by defocus generated by shifting a focus of the imaging lens group from a diffraction plane of the objective lens according to the magnitude of the geometrical aberration; and
correcting, with use of the imaging system deflector and along with the scanning of the electron beam, a deviation of the electron beam from an optical axis generated by scanning the electron beam over the specimen while shifting the focus of the imaging lens group from the diffraction plane of the objective lens.

2. The method of acquiring a dark-field image according to claim 1, wherein the imaging lens group comprises an intermediate lens and a projector lens that are disposed at a stage following the objective lens.

3. The method of acquiring a dark-field image according to claim 1, wherein
the predetermined angular range is from 50 mrad to 200 mrad.

* * * * *